United States Patent
Bonvalot et al.

(10) Patent No.: US 7,656,630 B2
(45) Date of Patent: Feb. 2, 2010

(54) ACTIVE PROTECTION DEVICE FOR PROTECTING CIRCUIT AGAINST MECHANICAL AND ELECTROMAGNETIC ATTACK

(75) Inventors: Béatrice Bonvalot, Meudon Cedex (FR); Claude Fermon, Orsay (FR); Myriam Pannetier, Gif sur Yvette (FR)

(73) Assignees: Commissariat a l'Energie Atomique, Paris (FR); Axalto SA, Meudon (FR)

( * ) Notice: Subject to any disclaimer, the term of this patent is extended or adjusted under 35 U.S.C. 154(b) by 387 days.

(21) Appl. No.: 11/659,675

(22) PCT Filed: Jul. 11, 2005

(86) PCT No.: PCT/IB2005/001951

§ 371 (c)(1),
(2), (4) Date: Feb. 7, 2007

(87) PCT Pub. No.: WO2006/011013

PCT Pub. Date: Feb. 2, 2006

(65) Prior Publication Data

US 2008/0088996 A1   Apr. 17, 2008

(30) Foreign Application Priority Data

Jul. 16, 2004   (EP) .................................. 04291834

(51) Int. Cl.
*H01T 23/00* (2006.01)
(52) U.S. Cl. .......................................... 361/78; 361/231
(58) Field of Classification Search .................. 361/78, 361/231, 232; 438/107, 238
See application file for complete search history.

(56) References Cited

U.S. PATENT DOCUMENTS

| 4,860,351 | A | 8/1989 | Weingart |
| 5,060,261 | A | 10/1991 | Avenier et al. |
| 6,306,681 | B1 * | 10/2001 | Ahn et al. .................... 438/107 |
| 2001/0033012 | A1 | 10/2001 | Koemmerling et al. |
| 2003/0081400 | A1 | 5/2003 | Agrawal et al. |

FOREIGN PATENT DOCUMENTS

| FR | 2 863 746 | 6/2005 |
| JP | 11 211804 | 8/1999 |
| WO | WO 03/085410 | 10/2003 |
| WO | WO 2004/055822 | 7/2004 |
| WO | WO 2004/055824 | 7/2004 |
| WO | WO 2004/055918 | 7/2004 |
| WO | WO 2004/064071 | 7/2004 |
| WO | WO 2004/105125 | 12/2004 |

* cited by examiner

*Primary Examiner*—Danny Nguyen
(74) *Attorney, Agent, or Firm*—Weingarten, Schurgin, Gagnebin & Lebovici LLP

(57) ABSTRACT

For protecting a circuit (1) against a mechanical or electromagnetic attack, an active protection device attached to the circuit comprises: —at least one generator (13, 14) for generating a magnetic field, —at least one magnetic sensor S1, S2, S3, S4 for measuring a value of the magnetic field, —an integrity circuit connected to the at least one magnetic sensor S1, S2, S3, S4 and to the circuit (1). The integrity circuit activates a reaction procedure in the circuit if the measured value of the magnetic field made by the magnetic sensor is out of a values domain, the values domain being correlated to the generated magnetic field.

20 Claims, 4 Drawing Sheets

ACTIVE PROTECTION DEVICE FOR PROTECTING CIRCUIT AGAINST MECHANICAL AND ELECTROMAGNETIC ATTACK

This application is a §371 national phase filing of PCT/IB2005/001951 filed Jul. 11, 2005, and claims priority to European application No. 04 291 834.2 filed Jul. 16, 2004.

FIELD OF THE INVENTION

The domain of the invention is the protection of integrated circuits containing at least one layer of active semiconductor material, and in particular those containing elements such as one or more memory (any type of memory: RAM, ROM, EPROM, EEPROM, flash memory . . . ) and/or a processor. Generally, several circuits are interconnected within one or several silicon layers, but they will be shortly named "the circuit to protect" in the following text.

The invention relates to an active protection device and method for protecting circuit against mechanical and electromagnetic attack. The invention also relates to a manufacturing method of an integrated circuit comprising an active protection device.

The active protection is intended to protect integrated circuits against electromagnetic attack (EMA), including frequency from light frequency to infra-red (IR) frequency and also to protect integrated circuit against investigation involving mechanical attack. A particular application is for integrated circuits adapted to be used in portable devices like microprocessor type smart-cards.

BACKGROUND OF THE INVENTION

Circuits and in particular integrated circuits which comprise processing unit and storage units are widely used, in particular in portable devices like bank or credit cards, identity cards, SIM card used in mobile telephone. Such portable devices generally enables a user to access to particular services or confidential data through electronic transaction (payment, identification, building access, use of telecommunication network . . . ) after a successful authentication proceeding. The authentication process is generally based on security related software means, cryptographic algorithms and also secret keys and confidential data stored and processed in the integrated circuit, or hardware means present in the integrated circuit. In the case of portable devices like smart-cards, hackers are interested in obtaining information regarding the functioning of the integrated circuits in order to manufacture cloned smart-cards and/or to fraudulently benefit of services for which they do not have the right. Such information can be obtained by studying the integrated circuits either passively or destructively or both.

Current circulating in the wires of an integrated circuit are creating magnetic fields in a frequency range between low frequencies (Hz range) to high frequencies (GHz range) depending on the current frequency. Local detection of these magnetic fields by a magnetic sensor is a direct measurement of circulating currents and hence of the local activity of an electrical device.

The use of a commercial hard disk reading head allows measuring directly the activity of particular subsystem constituting a part of an integrated circuit.

The use of such a measurement apparatus can be combined with mechanical or chemical abrasion and/or electromagnetic attack (EMA) in order to collect particular information. An EMA is based on the irradiation of the integrated circuit by electromagnetic waves, such as visible light, UV and near IR. The EMA is creating pairs (electron, hole) jumping the electronic gap up to the conducting level which can modify or substantially disturb the normal functioning of an integrated circuit.

The integrated circuit back side is particularly threatened because of the development of new integrated circuit debugging tools allowing working with high accuracy by modifying the integrated circuit, picking information using the IR transmission band in bulk silicon.

Smart-card standards impose to set-up protection against hardware attack through mask sensitive surfaces to optical inspection, probing and perturbations. The attack can be a mechanical attack during which the generator and/or the magnetic sensor are damaged. The attack can also be an electromagnetic attack for perturbing or spying the functioning of the circuit.

In order to prevent such intrusion or reading, it is known to use protective layers. In particular, magnetic shielding can be used to block radio and hyper-frequencies emissions of the integrated circuit. Further, metallic layers can be used to avoid light transmission to the integrated circuit. However, even with an extensive use of such type of hard layers, the variety of etching processes available today enables hackers to remove these protective layers and to access to the information stored in the integrated circuit by the above described means.

It is known to passively protect the integrated circuit.

In particular, WO 9912204 describes a device with security integrated circuit. The device comprises a mechanical layer attached on the active face of an integrated circuit. The back side of the integrated circuit is thinned in order to limit the physical attacks intended to access the integrated circuit surface. The mechanical layer constitutes a cover, i.e. a physical protection against attacks allowing pushing forward the electromagnetic radiation sensor from the integrated circuit surface and/or enabling to absorb the incoming light. The hacker sensor means can only be positioned far from the integrated circuit surface to accurately pick up signal that occurs on interesting working areas during integrated circuit functioning. However, the integrated circuit global emission may be read.

WO 0024058 relates to an integrated circuit chip secured against the action of electromagnetic radiation. A physical protection consisting in a complementary layer attached to the active face of the integrated circuit, the complementary layer being doped with Silicon doping element. Additionally, a metallic layer and irregularities on its surface can be added to enhance the physical protection.

WO 0063836 describes a cap for protecting an integrated circuit against physical attacks intending to access the layer of active semiconductor material of the integrated circuit by a controlled destruction of the cap protecting the active layer. However, it is still possible to grind this cap and removed it. Further, this protection is passive and does not guarantee an intrusive action from the back side.

It is also known to settle an active survey of hardware hacking by adding complex layers electrically connected to the integrated circuit.

In particular, WO 9616378 describes a security device comprising two chips stacked and interconnected face to face. The security device consists in erasing the secret information stored in one of the chips in the case of breaking or perturbation of the connection between the two chips. Such a device only guarantees a limited access to the layer of active semiconductor material while not giving any protection against electromagnetism reading.

SUMMARY OF THE INVENTION

One goal of the invention is to propose an active protection against hardware attacks of the circuit to protect.

The invention creates next to the circuit to protect against mechanical, chemical and/or electromagnetic attack a magnetic field that works as a magnetic seal. The goal of the invention is then to check the magnetic configuration resulting from this magnetic seal, and in case of a significant change, to perform an emergency safety process. Said process may be either to send an information signal or to modify the functioning of the circuit in order to make unsuccessful any further electromagnetic attack.

More precisely, the present invention relates to an active protection device for protecting a circuit against an attack, the active protection device being attached to the circuit, wherein the active protection device comprises:

- at least one layer of active semiconductor material, this layer being electrically connected to contact pads for interfacing external electronic circuits
- at least one field generator able to create a magnetic field next to the circuit to protect,
- at least one magnetic sensor able to measure the value of the magnetic field,
- an intrusion checking device, called integrity circuit, connected either to the at least one magnetic sensor and to the one layer of active semiconductor material from the circuit to protect and/or external electronic circuits, said integrity circuit being able to perform an emergency safety process in order to modify the functioning of the circuit to protect and/or to send an electrical signal to inform an attack happens or happened if the measured value of the magnetic field made by the magnetic sensor is out of a predetermined range, said range varies according to the value of the induced magnetic field.

According to a low level embodiment of the invention, the emergency safety process consists in the emission of a trigger toward either the circuit to protect or toward an external electronic circuit via an electrical contact pad. Advantageously, this trigger is a remaining change of state (e.g. flag).

According to another embodiment of the invention, the emergency safety process consists in the processing of a specific sequence that modifies the functioning of the circuit to protect.

Advantageously, this specific sequence inhibits at least one functionality of the circuit to protect.

According to a preferential embodiment of the invention, the circuit to protect contains at least a memory circuit, and the specific sequence erases at least a part of this memory circuit.

According to another preferential embodiment of the invention, the circuit to protect contains at least a processor, and the specific sequence modifies at least a part of this processor's program.

Advantageously, the circuit to be protected comprises the integrity circuit. In this case, if the safety process consists in processing a specific sequence that modifies the functioning of the circuit to protect, this modification is designed not to affect the integrity circuit operation.

The magnetic sensor can be for instance a Hall effect type sensor or a magneto-resistive type sensor.

The magnetic field generator can be a hard magnet, for example made of a magnetic material like Ferrites, CoPt, $SmCo_5$, or NdFeB material.

The magnetic field generator can also be a coil embedded in a structural material and the electronic generator able to drive in it an adequate current. In a particular embodiment, this coil is a resonating one.

In another particular embodiment, the electronic driver supplying alternating current in the coil is frequency adjustable.

The at least one magnetic sensor and the at least one magnetic field generator can be attached to the upper surface and/or to the lower surface of the integrated circuit. According to a specific embodiment, the protective device of the invention comprises at least two field generators, advantageously one on each side of the circuit, and at least two magnetic sensors attached on the same side of the circuit to protect.

According to another specific embodiment, the protective device of the invention comprises two generators, advantageously one on each side of the circuit, and at least two magnetic sensors attached on booth sides of the circuit to protect.

The connection between the magnetic sensor and the integrity circuit can be manufactured according to Ni balls, conductive epoxy, wire-bonding or conductive glue connection technique.

According to a possible embodiment of the device of the invention, the number of the at least one magnetic sensor is even, and those sensors are half bridge or bridge connected.

As an example, the magnetic sensors can be separated by a distance comprised in a range between 50 µm and 150 µm, and advantageously, equal to 100 µm. An array of sensors allows a more efficient protection of the circuit. The number of sensors is only limited by the cost and complexity of the protection device. An array of for example 5 to 10 sensors gives a rather high level of protection against attacks.

For circuit comprising multi-chips, the sensors may be placed randomly on the circuit, but advantageously their relative position is designed in such a way that the sensitivity is improved around the very places generating the stronger or the most informative electrical signals.

According to another possible embodiment, the device further comprises, on at least one of the upper and lower surfaces having electrical contacts, at least a screening layer against the electromagnetic and radiofrequency fields emitted by the active circuit to protect, said screening layer comprising at least a first layer made of soft magnetic material with a high relative permeability larger than 500.

Advantageously, the device further comprises an additional outer layer which is a mechanically hard layer exhibiting a good resistance to mechanical polishing or dry etching.

Advantageously, the device further comprises an additional a perturbation layer made on the screening layer, said perturbation layer comprising an inhomogeneous hard magnetic material able to induce strong magnetic perturbation, at least of the same order of magnitude than the electromagnetic and radiofrequency fields emitted by said active sub-assembly The invention also relates to a manufacturing process for actively protecting a circuit against an attack, the circuit being attached to an active protection device comprising at least one magnetic field generator, at least one magnetic sensor, and an intrusion checking device connected to the at least one magnetic sensor and to the circuit. The method comprises the steps of:

- measuring a value of the magnetic field generated by the magnetic field generator, said measurement being performed by the magnetic sensor,
- checking the integrity of the protection device by comparing the measured value of the magnetic field to a trigger values domain, the trigger values domain being advantageously function of the generated magnetic field, said checking being performed by the intrusion checking device, and activating a protecting an emergency safety process as a reaction against the supposed intrusion if the measured value of the magnetic field made by the magnetic sensor is out of a predetermined range, said activation being triggering an alarm signal, and advantageously proceeding the emergency safety process.

The emergency safety process may present many miscellaneous functionalities, as for instance inhibiting at least one functionality of the circuit, or in erasing at least a part of a memory of the circuit.

BRIEF DESCRIPTION OF THE DRAWINGS

The present invention is illustrated by way of example and not limited to the accompanying figures, in which like references indicate similar elements:

FIG. 1.B schematically shows a top view of an integrated circuit according to a first phase of the manufacturing method of the invention;

DETAILED DESCRIPTION OF THE INVENTION

Figure 1A:
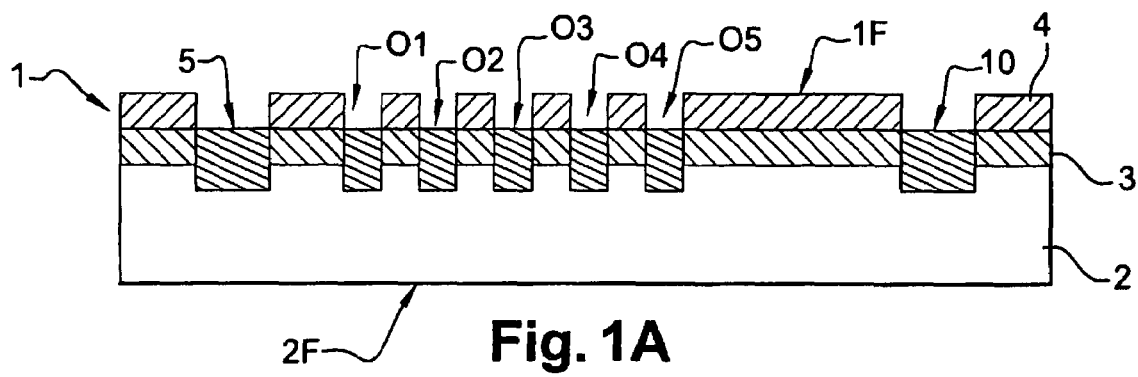
FIG. 1.A schematically illustrates a cross-section in an integrated circuit along line AA of FIG. 1.B according to a first phase of the manufacturing method of the invention.
Figure 1B:
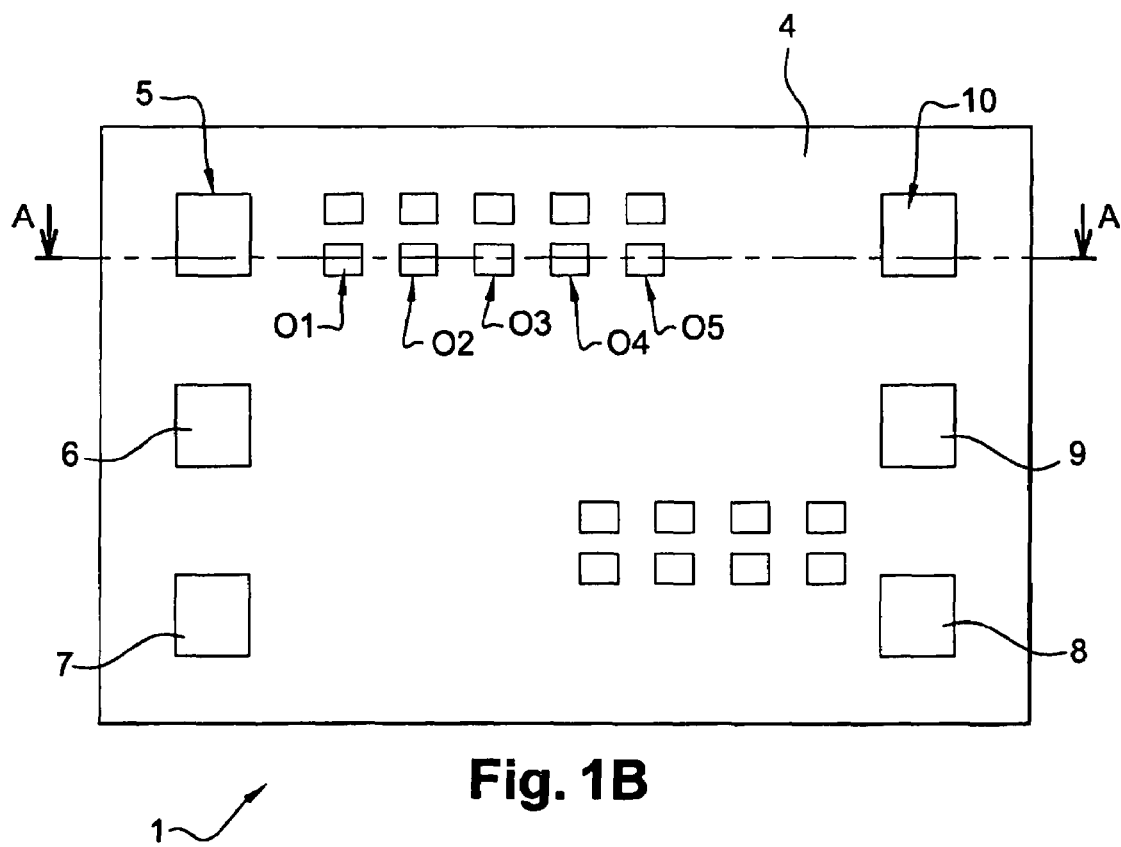

FIG. 1-B shows a top view of an embedded composite integrated circuit 1 comprising the circuit to protect and the invention settled on it. FIG. 1-B shows an upper view of this composite integrated circuit, and FIG. 1-A shows a cross-section of it along the line AA of FIG. 1-B.

The integrated composite integrated circuit 1 comprises one layer of active semiconductor material 2 containing the circuit to protect, an extra layer of semiconducting material 3 containing the integrity circuit its connexions (in this case not included in layer 2), and a protective layer 4.

The circuit to protect comprises different electronic elements like memories, micro-processors, buses, connectors . . . etc.

If the generator is made of a coil and its driving electronics, they are both contained in the extra layer of semiconducting material 3.

The protective layer 4 is attached on the top of the extra layer of semiconducting material 3 containing the integrity circuit.

The composite integrated circuit 1 has an upper surface 1F constituted by the top surface of the protective layer 4, and a lower surface 2F opposite to the upper surface, constituted by the lower surface of the layer of active semiconductor material 2.

The composite integrated circuit also comprises pads 5, 6, 7, 8, 9 and 10 for connection of the circuit of the active surface to external electrical connection to other electronic device (not shown).

The above described layer of active semiconductor material 2 containing the circuit to protect and also the manufacturing method of such an integrated circuit is well known by a man skilled in the art and will not be further described. The deposition or attachment of extra layers is also well known and won't be further described.

According to the present invention, the integrated circuit further comprises pads openings O1, O2, O3, O4, O5 (FIG. 1-A) enabling connection of the circuit of the active surface to external electrical connection to sensors.

Advantageously, layer 3 comprises a particular area dedicated to an intrusion checking device (not shown) which is connected to the pads openings O1, O2, O3, O4, O5 and also the other pads openings shown on FIG. 1-B and not referenced.

Figure 6:
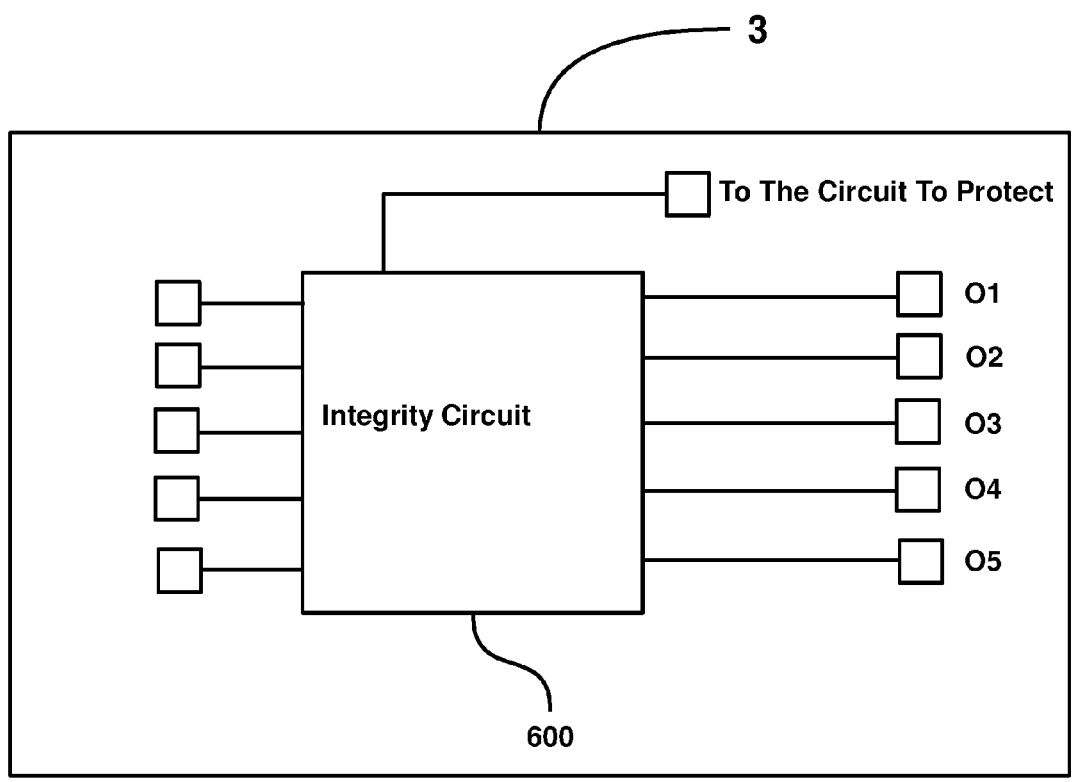
FIG. 6 schematically shows a top view of an extra layer of semiconducting material in an integrated circuit according to one embodiment of the present invention.

Referring now to FIG. 6, the intrusion checking device 600, also referred to as an integrity circuit, is provided in the additional semiconductor layer 3. The integrity circuit 600 is coupled to the pads openings O1, O2, O3, O4, O5 (shown in FIG. 1-A) to access the sensors as described herein.

From a functional view, referring again to FIG. 6, the integrity circuit 600 obtains information from the sensors 81, 82, 83, 84, 85 (shown in FIG. 2) connected to the pads openings O1, O2, O3, O4, O5. The information received on the pads is then processed by the integrity circuit 600 and, if necessary, control signal(s) to the circuit being protected are issued.

Figure 2:
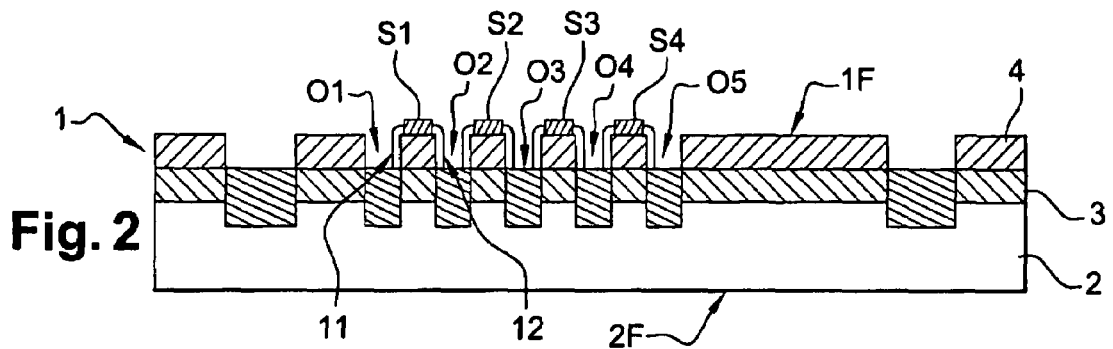
FIG. 2 schematically illustrates a cross-section in an integrated circuit according to a second phase of the manufacturing method of the invention.

FIG. 2 illustrates a cross-section in an integrated circuit according to a second phase of the manufacturing process of the invention. In this phase of the manufacturing process, magnetic sensors S1, S2, S3, S4 are attached to the protective layer 4 on the upper surface 1F, and connected to the suited electrical contact in layer 3 through the pads openings O1, O2, O3, O4, O5 (other non-referenced/not shown sensors are also connected via the other openings which could be seen on FIG. 1-B). These connections enable to connect each magnetic sensor to the intrusion checking device. In particular, the magnetic sensor S1 is connected to layer 3 via electrical connections 11 and 12 through the pads openings O1 and O2 respectively. Similarly, the other sensor S2 to S4 are also connected, and so on. Any technical solution allowing a reliable electric contact can constitute the electrical connection between each magnetic sensor and the suited electrical contact on layer 3, as for example a metallic path, wire bonding, or conductive glue deposed by ink injection . . . etc.

If there is at least one magnetic field generator made with permanent magnets, they are attached to the composite integrated circuit during a third phase of the manufacturing process, once the magnetic sensors are connected to the integrity circuit by layer 3 connection.

Figure 3:
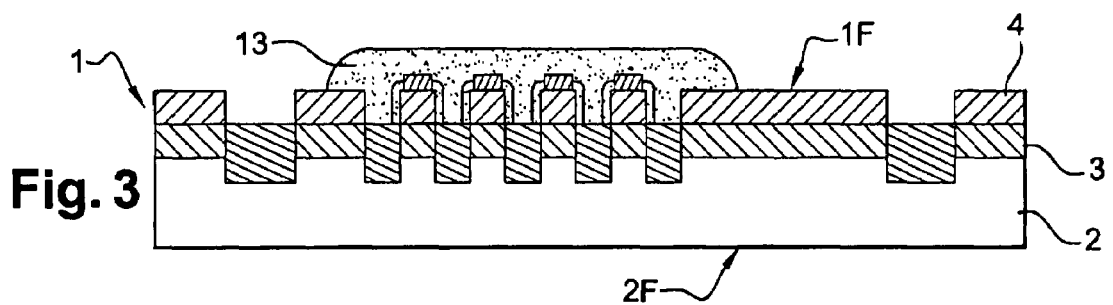
FIG. 3 schematically illustrates a cross-section in an integrated circuit according to a third phase of the manufacturing method of the invention, and also a first embodiment of a protecting device adapted to an integrated circuit.

In a first embodiment of a protecting device adapted to an integrated circuit shown on FIG. 3, a magnetic field generator 13 is attached on the upper surface 1F of the composite integrated circuit 1. According to this first embodiment, the field generator is a magnetic material covering at least partially the upper surface 1F of the composite integrated circuit 1. The magnetic material may also cover the magnetic sensors. Advantageously, the magnetic material spread on layer 3 covers the very places generating the stronger or the most informative electrical signals.

Figure 4:
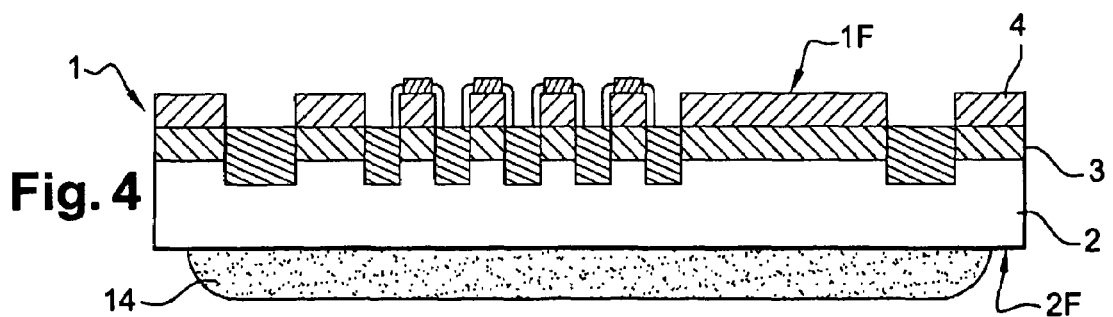
FIG. 4 schematically illustrates a cross-section in an integrated circuit according to a third phase of the manufacturing method of the invention, and also a second embodiment of a protecting device adapted to an integrated circuit.

In a second embodiment of a protecting device adapted to an integrated circuit shown on FIG. 4, a magnetic field generator 14 is still made of a permanent magnet, but attached on the lower surface 2F of the composite integrated circuit 1.

According to this second embodiment, the filed generator is a magnetic material covering at least partially the lower surface 2F of the composite integrated circuit 1. Advantageously, the magnetic material spread on layer 3 covers the very places generating the stronger or the most informative electrical signals.

Figure 5:
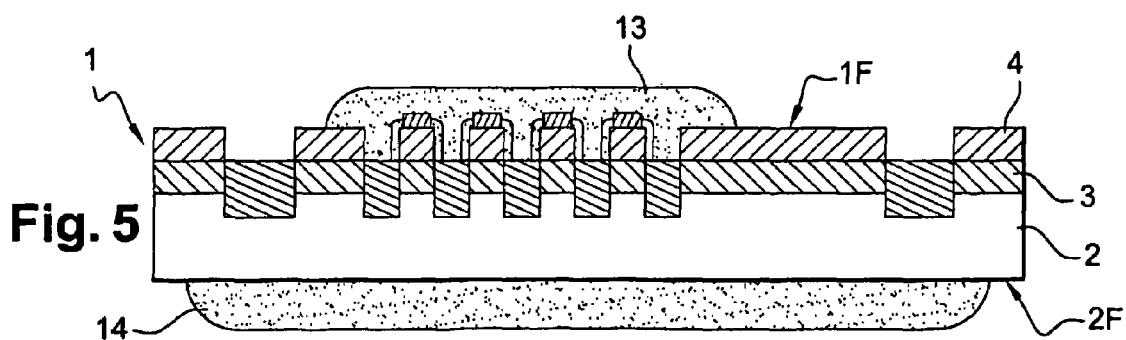
FIG. 5 schematically illustrates a cross-section in an integrated circuit according to a third phase of the manufacturing method of the invention, and also a third embodiment of a protecting device adapted to an integrated circuit.

In a third embodiment of a protecting device adapted to an integrated circuit shown on FIG. 5, the magnetic field generator 13, 14 is still made of a permanent magnet, but attached respectively on the upper surface 1F and on the lower surface 2F of the composite integrated circuit 1. According to this third embodiment, the field generator is made of first a magnetic material covering at least partially the upper surface 1F and the lower surface 2F of the composite integrated circuit 1. The magnetic materials covering the upper surface 1F and the one covering the lower surface 2F may be either from the same type of materials, or from different ones. The magnetic material on the upper surface 1F may cover the magnetic sensors. Advantageously, the magnetic material spread on layer 3 covers the very places generating the stronger or the most informative electrical signals.

According to a preferred embodiment, the magnetic field generator may be constituted by a permanent perturbation layer comprising an inhomogeneous hard magnetic material able to induce strong magnetic perturbation, at least of the same order of magnitude than the electromagnetic and radiofrequency fields emitted by the active circuit to protect against attacks. In the above-described embodiments, the magnetic material can be structured, or the surface of the magnetic material can be rough. In another embodiment, the magnetic field generator may also be composite, lamellar or granular. In another embodiment, the magnetic field generator may be structured in a patterned way, presenting spatial inhomogeneity to induce magnetic permanent inhomogeneity.

The use of magnetic material is advantageous because it saves power.

The magnetic field generator can be a magnet fabricated by using hard magnetic materials like Ferrites, $SmCO_5$, NdFeB or CoPt. The magnetic material CoPt can be for example deposited either by electro-deposition or by sputtering methods. The magnetic material Ferrites, $SmCO_5$, NdFeB will be preferably deposited using screen printing or plasma spraying methods.

The thickness of the magnets is related to:
the remanent saturation of the magnetic material,
the width of the magnet, and
the distance between the magnet and the sensors.

The magnetization direction of the magnets can be either perpendicular or parallel to layer 3. The position/orientation of the sensors depends on this magnetization direction.

In the above-described embodiments, the magnetic field generator was a magnetic material. However, though not shown on the figures, the magnetic field generator can also be a circuit (wire or coil) driven with a continuous or alternating current. Such a magnetic field producer is typically used when power consumption is not a problem.

The use of a coil for creating a magnetic field allows using a specific frequency which will be common to the sensor and the coil/wire. Advantageously, such coil/wire gives a rather high immunity relatively to applied external fields. An additional protection can be obtained if the working frequency of the sensor and the coil/wire varies as function of time.

According to an embodiment of the invention, the at least one magnetic sensor can be a Hall type magnetic sensor or a magneto-resistive sensor. The magnetic fields to be measured are of the $10^{-3}$ Tesla order.

Known Hall sensors are generally based on semiconductor material and are sensitive to the field perpendicular to the surface. A Hall sensor has usually a cross form which define an active region at the centre of the cross. The material used is in general a semiconductor. Good results are obtained with GaAs layers but Si films can be used.

An example of a manufacturing process according to the invention for using as magnetic sensors Hall type magnetic sensors will be described below.

After the fabrication of the composite integrated circuit 1 (see FIGS. 1-A and 1-B), Silicon Hall crosses are attached to the upper surface 1F between two openings, for example between O1 and O2, O2 and O3, O3 and O4, and O4 and O5 respectively (see FIG. 2). Then, the sensors are connected to layer 3 through the openings. The magnetic sensors are sensitive to magnetic fields applied perpendicularly to the upper surface 1F. As an example, the size of the Hall cross is 5 µm.

Advantageously, the invention contains at least two magnetic sensors, mounted in a half-bridge configuration at different places of the chip (see FIG. 1-B).

Finally, the composite integrated circuit 1 with integrated sensors is passivated. Between the two sensors, a magnetic material is deposited with an in-plane magnetization. The thickness of the magnet is for example about 2 microns.

The field created on each sensor is then nearly vertical with an opposite sign on each sensor.

The magnet layer can be covered by a non magnetic material shielding like Ti. The system can be covered by a soft magnetic layer composed of a NiFe and CoZr alloys. The soft magnetic layer has for example a thickness of 20 µm.

The previous layers can then be covered with a layer made of rough CoPt film with a thickness of for example 5 µm. All the layers are deposed through a known electro-deposition process allowing a very low manufacturing cost.

According to an other embodiment of the invention, the at least one magnetic sensor is made of one or several magneto-resistive type sensors, as for instance in the following example.

Known magneto-resistive sensors like anisotropic magneto-resistive sensor (AMR) or giant magneto-resistive sensor (GMR) are sensitive to the in plane component of the magnetic field. GMR sensors are usually fabricated in spin valve configuration with a shape of the yoke type. The sensor can be made of a hard magnetic layer, like for example IrMn and CoFe, separated from a soft magnetic layer, like for example NiFe/CoFe, by an intermediate Cu thin layer. The sensitivity of that spin valve is about 5% of magneto-resistance by $10^{-3}$ Tesla.

Once again, after the fabrication of the composite integrated circuit 1 (see FIGS. 1-A and 1-B), the different magnetic layers of the GMR sensors are deposed through a known electro-deposition process on the upper surface 1F of the integrated circuit.

As another alternative, GMR sensors can be organized on the first surface of the integrated circuit as an array. In this case, the soft magnetic metallic layer (for example 20 µm of NiFe and CoZr) is deposited on the passivated integrated circuit. Then, an insulating layer is deposited on the soft magnetic layer. Subsequently, a GMR stack is deposited by sputtering technique on the insulating layer. The GMR array is then patterned and connected to the contacts through the openings. Finally, another insulating layer and a hard magnetic layer are deposited. The magnetic hard layer is made of, for example, a NdFeB powder included in an epoxy resin (the orientation of grains is random).

The soft magnetic metallic layer acts as an electromagnetic shielding and light shielding. The insulating layer acts as an electrical insulation.

Advantageously, in the different embodiments presented above, if pairs of sensors are mounted in a bridge configuration, the active protection device is insensitive to any uniform applied external magnetic field. Further, Hall sensors mounted in bridge configuration show a good immunity against the application of rather strong external magnetic field.

In another embodiment of the invention, the at least one magnetic sensor is made of one or several GMR sensors. They are more sensitive than Hall sensors, however, GMR sensors can be saturated by large magnetic fields.

Now, the functioning of the intrusion checking device will be described in more details.

The integrity circuit is connected to the magnetic sensor and checks for the integrity of the different layers. Any intrusive damage or perturbation made to any elements of the active protection device, in particular to the magnetic generator or to the sensor will affect a measurement of the magnetic field. This modification of the magnetic field is measurable and analyzed by the integrity circuit. Depending of the analysis made, the integrity circuit will induce a reaction directly affecting the integrated circuit to be protected.

The reaction can be:

an erasing of particular data in memory to the totality of the memory, or an erasing of some block controlling certain integrated circuit functionalities, or blocking certain integrated circuit functionalities (e.g. crypto-calculations), or the micro-processor of the integrated circuit may be settled in an infinite loop, or a software flag is put in place.

Performing those functionalities is well known from skilled engineers, and hence won't be described here.

Practically, the magnetic sensor measures a value characteristic of the magnetic field generated by the magnetic field generator (a voltage or a resistance value).

Irrespective of the position of the sensors (either on the top of the circuit or at the bottom of the circuit) or of the generators (either on the top of the circuit, or at the bottom of the circuit), as soon as a perturbation of the magnetic field will occur (through damages to the sensor or the generator or through application of an external electromagnetic field), the measured value of the magnetic field will vary.

The integrity circuit performed a comparison between the measured values and referenced ones, for example a domain of trigger values which are correlated to the magnetic field generated by the magnetic filed generator. If the measured values of the magnetic field are out of the trigger value domain, a reaction procedure is activated by the integrity circuit. The integrity circuit controls the reaction procedure.

In case of a wire/coil magnetic field generator, the integrity circuit can control the frequency of the current circulating in the generator through the electronic driver of the coil. In this case the trigger value domain will vary as a function of the frequency imposed by the integrity circuit.

This comparison can be performed continuously, or from time to time, or each time the integrated circuit is activated or ran under the control of the integrity circuit.

Advantageously, the trigger value domain is defined at the first running of the integrated circuit. The values of the magnetic field are measured and stored in the integrity circuit.

Advantageously, a variation or a drift on these values is allowed in a certain range of some percent. If the variation is above a fixed value, for example 10% the reaction procedure is activated.

Figure 7:
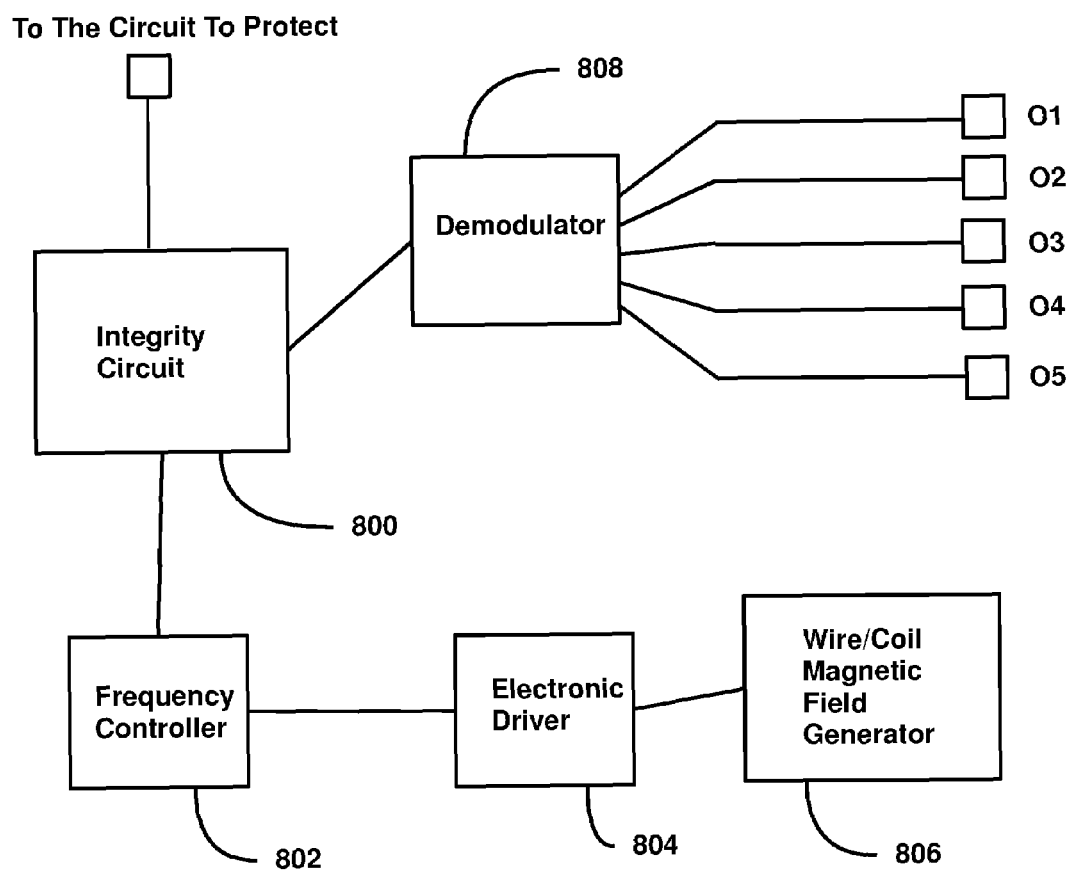
FIG. 7 is a block diagram according to an alternate embodiment of the present invention.

Referring now to FIG. 7, in the case where a wire/coil magnetic field generator is used, an integrity circuit 800 is coupled to a frequency controller 802 that is coupled to drive an electronic driver 804 that, ultimately, controls a wire/coil magnetic field generator 806. As above, the integrity circuit 800 operates the magnetic field generator 806 at a desired frequency.

A demodulator 808 is provided to receive the signals from the sensors S1, S2, S3, S4, S5 (not shown in FIG. 7) via the pads openings O1, O2, O3, O4, O5. The integrity circuit 800 receives the demodulated signals from the demodulator 808 and determines whether there has been a perturbation of the magnetic field that indicates an attack is in progress. As above, the integrity circuit 800 can respond to such an attack in one or more ways to prevent unauthorized access to the circuit to protect.

A particular application of the invention is in the domain of portable object, like smart-card, in particular micro-processor smart-card. A smart-card comprises an integrated circuit connected to a module, the module being embedded in a plastic card. The module comprises contact pads for connection with a smart-card reader and/or an antenna for contact-less communication with a contact-less terminal. The active protection device can be connected to the module comprising the integrated circuit. The active protection device can protect the confidential data and/or the particular crypto-algorithm contained in the card against fraudulent retro-engineering.

The invention has been described in details with regards to a particular circuit, namely an integrated circuit. However, the invention is also applicable for other kind of circuit, for example electronic components, electronic device, computer mother board.

The invention claimed is:

1. An active protection device for protecting an integrated circuit containing at least one layer of active semiconductor material against an electromagnetic attack, eventually after a mechanical or chemical attack, wherein the active protection device comprises:

at least one layer of active semiconductor material, this layer being electrically connected to contact pads for interfacing external electronic circuits at least one field generator able to create a magnetic field next to the circuit to protect, at least one magnetic sensor able to measure the value of the magnetic field, an intrusion checking device, called integrity circuit, connected either to the at least one magnetic sensor and to the one layer of active semiconductor material from the circuit to protect and/or external electronic circuits, said integrity circuit being able to perform an emergency safety process in order to modify the functioning of the circuit to protect and/or to send an electrical signal to inform an attack happens or happened if the measured value of the magnetic field made by the magnetic sensor is out of a predetermined range, said range varies according to the value of the induced magnetic field.

2. An active protection device according to claim 1, wherein the at least one field generator are at least two, and are attached on the same side of the circuit to protect.

3. An active protection device according to claim 1, wherein the at least one field generator are at least two, and are attached on both sides of the circuit to protect.

4. An active protection device according to claim 1, wherein the at least one field generator is made of a permanent magnet.

5. An active protection device according to claim 4, wherein the permanent magnet is made of a magnetic material chosen among the group of magnetic material comprising the Ferrites, CoPt, $SmCo_5$, and NdFeB material.

6. An active protection device according to claim 1, wherein the at least one field generator is made of a coil driven with a continuous current supplied by an electronic driver.

7. An active protection device according to claim 1, wherein the at least one field generator is made of a coil driven with an alternating current supplied by an electronic driver, and the signals delivered by the at least one magnetic sensor are processed by a demodulator before being compared to a magnetic range in the integrity circuit.

8. An active protection device according to claim 7, wherein the electronic driver supplying alternating current in the coil is frequency adjustable, and its frequency is determined by a frequency controller, an electric signal function of this frequency being sent to the demodulator.

9. An active protection device according to claim 1, wherein the at least one magnetic sensor is a Hall-effect type sensor.

10. An active protection device according to claim 1, wherein the at least one magnetic sensor is a magnetoresistance type sensor.

11. An active protection device according to claim 1, wherein the at least one magnetic sensors are at least two, and separated by a distance range between 50 μm and 150 μm.

12. An active protection device according to claim 1, wherein the number of the at least one magnetic sensor is even, and those sensors are half bridge or bridge connected.

13. An active protection device according to claim 12, wherein the number of the at least one magnetic sensor is included in the range from 4 to 10.

14. An active protection device according to claim 1, wherein the emergency safety process consists in the emission of a trigger toward either the circuit to protect or toward an external electronic circuit via an electrical contact pad.

15. An active protection device according to claim 1, wherein the emergency safety process consists in the processing of a specific sequence that modifies the functioning of the circuit to protect.

16. An active protection device according to claim 15, wherein the specific sequence inhibits at least one functionality of the circuit to protect.

17. An active protection device according to claim 15, wherein the circuit to protect contains at least a memory circuit, and the specific sequence erases at least a part of this memory circuit.

18. An active protection device according to claim 15, wherein the circuit to protect contains at least a processor, and the specific sequence modifies at least a part of this processor's program.

19. An active protection device according to claim 1, wherein the field generator is made of a magnetic material covering the places generating the stronger or the most informative electrical signals.

20. An active protection device according to claim 2, wherein:

the at least one field generator are at least two, and are attached on both sides of the circuit to protect;

the at least one field generator is made of a permanent magnet;

the at least one field generator is made of one of a coil driven with a continuous current supplied by an electronic driver and a coil driven with an alternating current supplied by an electronic driver, and the signals delivered by the at least one magnetic sensor are processed by a demodulator before being compared to a magnetic range in the integrity circuit;

the electronic driver supplying alternating current in the coil is frequency adjustable, and its frequency is determined by a frequency controller, an electric signal function of this frequency being sent to the demodulator;

the at least one magnetic sensor is a Hall-effect type sensor;

the at least one magnetic sensor is a magnetoresistance type sensor;

the at least one magnetic sensors are at least two, and separated by a distance range between 50 μm and 150 μm;

the number of the at least one magnetic sensor is even, and those sensors are half bridge or bridge connected;

the number of the at least one magnetic sensor is included in the range from 4 to 10;

the emergency safety process consists in the emission of a trigger toward either the circuit to protect or toward an external electronic circuit via an electrical contact pad;

the emergency safety process consists in the processing of a specific sequence that modifies the functioning of the circuit to protect;

the circuit to protect contains one of at least a memory circuit, and the specific sequence erases at least a part of this memory circuit and at least a processor, and the specific sequence modifies at least a part of this processor's program; and the field generator is made of a magnetic material covering the places generating the stronger or the most informative electrical signals.

* * * * *

UNITED STATES PATENT AND TRADEMARK OFFICE
CERTIFICATE OF CORRECTION

| | | |
|---|---|---|
| PATENT NO. | : 7,656,630 B2 | Page 1 of 1 |
| APPLICATION NO. | : 11/659675 | |
| DATED | : February 2, 2010 | |
| INVENTOR(S) | : Beatrice Bonvalot et al. | |

It is certified that error appears in the above-identified patent and that said Letters Patent is hereby corrected as shown below:

Column 6, lines 29-30, "81, 82, 83, 84, 85" should read --S1, S2, S3, S4, S5--.

Signed and Sealed this
Sixteenth Day of August, 2011

David J. Kappos
*Director of the United States Patent and Trademark Office*